United States Patent [19]
Sakamoto et al.

[11] Patent Number: 5,886,374
[45] Date of Patent: Mar. 23, 1999

[54] OPTICALLY SENSITIVE DEVICE AND METHOD

[75] Inventors: Kurt K. Sakamoto, Chandler; Peter J. Zdebel, Mesa; Christopher K. Y. Chun, Gilbert, all of Ariz.

[73] Assignee: Motorola, Inc., Schaumburg, Ill.

[21] Appl. No.: 2,801

[22] Filed: Jan. 5, 1998

[51] Int. Cl.⁶ ............. H01L 31/062; H01L 31/113; H01L 31/075; H01L 31/105
[52] U.S. Cl. .......................... 257/292; 257/458
[58] Field of Search ..................... 257/292, 458

[56] References Cited

U.S. PATENT DOCUMENTS

| | | |
|---|---|---|
| 4,926,231 | 5/1990 | Hwang et al. |
| 5,304,949 | 4/1994 | Chun .................. 330/296 |
| 5,355,013 | 10/1994 | Parker . |
| 5,401,999 | 3/1995 | Bayraktaroglu . |

FOREIGN PATENT DOCUMENTS 55-124259  9/1980  Japan .

Primary Examiner—Stephen D. Meier
Attorney, Agent, or Firm—Rennie William Dover

[57] ABSTRACT

A process combines a high performance silicon pin diode (60) and other semiconductor devices such as transistors, resistors, and capacitors. The pin diode (60) is formed beneath an epitaxial layer (44) of the device at a depth that maximizes absorption of light having a wavelength greater than approximately 600 nanometers. Devices such as transistors are formed in the epitaxial layer (44). An integrated circuit has a substrate (41), an intrinsically doped layer (42), a buried layer (43), and an epitaxial layer (44). An isolation region (45) isolates an intrinsically doped region (46), a buried layer region (47), and the epitaxial layer region (48). The pin diode (32) has a substrate (41), an intrinsically doped region (46), and a buried layer region (47). A polysilicon region (62) provides a top side contact for the pin diode (60).

20 Claims, 4 Drawing Sheets

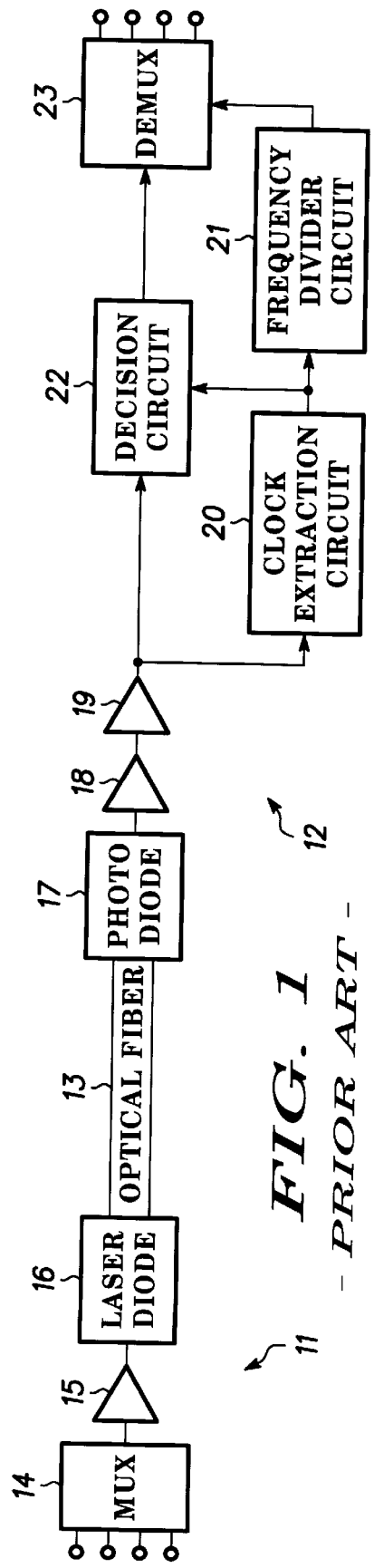
FIG. 1 – PRIOR ART –
FIG. 2 – PRIOR ART –
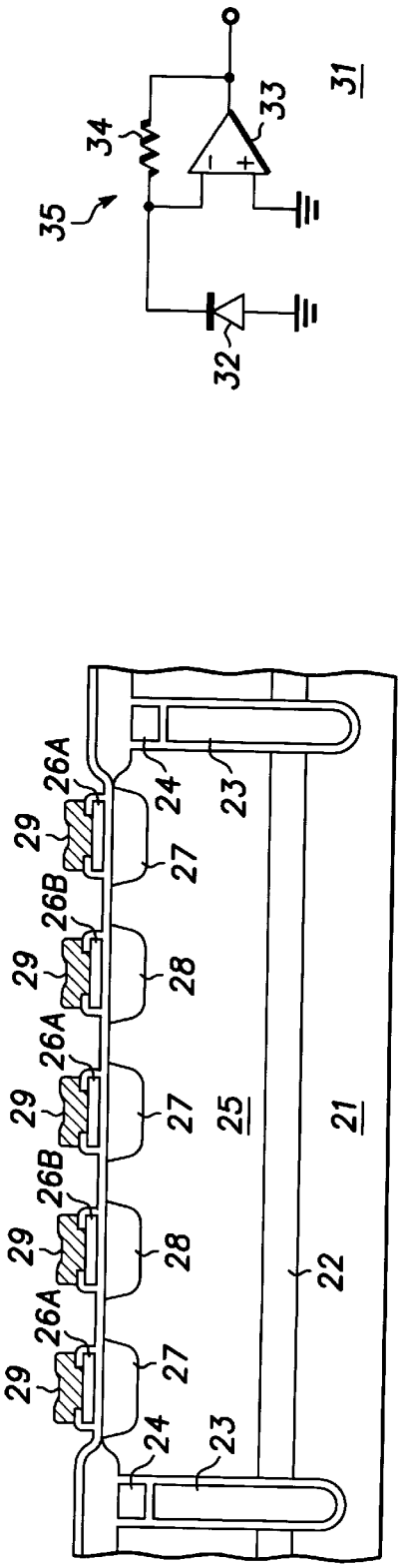
FIG. 3

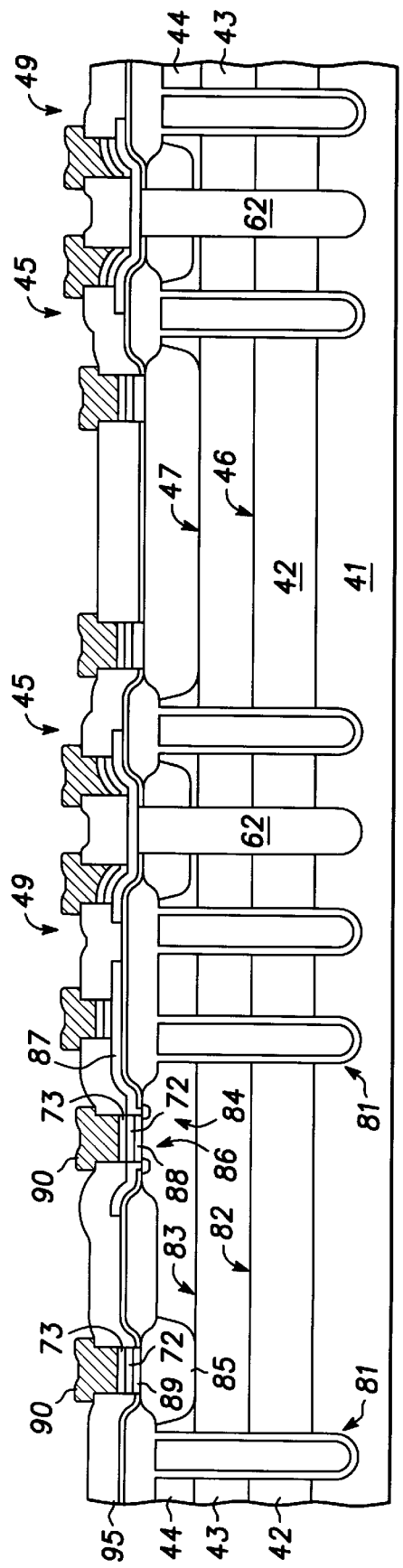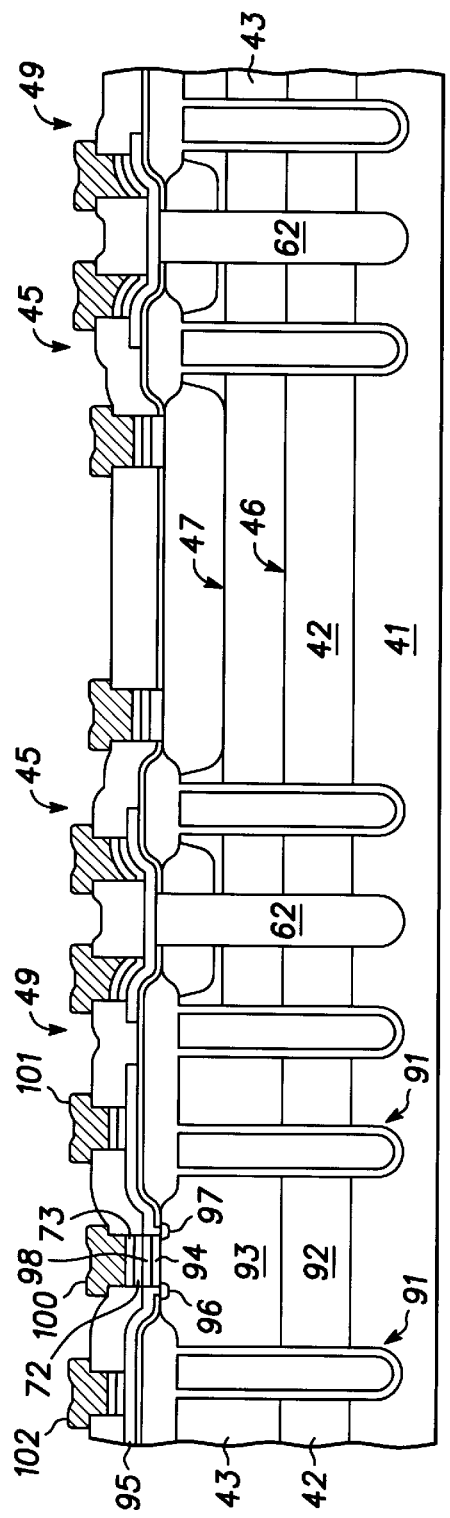

OPTICALLY SENSITIVE DEVICE AND METHOD

BACKGROUND OF THE INVENTION

The present invention relates, in general, to optical systems and, more particularly, to an integrated optical receiver.

The use of optical interconnect systems is gaining wide spread acceptance for transferring data at high speeds. Applications such as Local Area Networks (LANs), Multimedia, and the Internet are integrating optical solutions into their systems because they have the capability of meeting present and future needs. The main competition to an optical interconnect system is a copper interconnect system. Copper interconnect systems are inefficient at transmitting data at transfer rates exceeding 300 megabits/second. Copper interconnect systems are also lossy, making long runs of interconnect impossible without intermediate amplification stages. Unlike copper interconnect, optical (or fiber) interconnect has extremely high bandwidth and low loss. In particular, optical interconnect is ideal for data transfer in the 300 megabit/second to 40 gigabit/second range for the applications described hereinbefore.

FIG. 1 is a schematic diagram of a prior art transmitter system 11 and a receiver system 12 for sending data across an optical fiber 13. Transmitter system 11 converts a plurality of electronic signals into a stream of data bits. Transmitter system 11 comprises a multiplexer (MUX) 14, a laser driver 15, and a laser diode 16. The high speed of data transmission of an optical system allows multiple data channels to be ported through a single link. Providing more than one data channel ensures that the optical link is highly utilized. Multiplexer 14 has a plurality of inputs and a single output. Multiplexer 14 is a switching circuit coupling one of the inputs to the output. Laser driver 15 receives a signal from multiplexer 14 and has an output coupled to laser diode 16. Laser driver 15 enables laser diode 16 to transmit an optical signal corresponding to the electrical signal from multiplexer 14. Laser diode 16 is connected to optical fiber 13 for carrying the optical signal.

Receiver system 12 comprises a photodiode 17, a preamplifier 18, an amplifier 19, a clock extraction circuit 20, a frequency divider circuit 21, a decision circuit 22, and a demultiplexer 23. Photodiode 17 is a reverse biased diode sensitive to the frequency of light emitted by laser diode 16. Photodiode 17 is connected to optical fiber 13. Light transmitted through optical fiber 13 is absorbed by photodiode 17 creating electron-hole pairs. An electric field across reverse biased photodiode 17 forms a current with the electron-hole pairs corresponding to the light being transmitted.

Preamplifier 18 amplifies the small current signal generated by photodiode 17. The small current signal can be either an analog or a digital signal. In general, preamplifier 18 is a transimpedance amplifier that converts the optically generated current to a voltage signal. Amplifier 19 further amplifies the voltage signal produced by preamplifier 18. The amplified signal of amplifier 19 requires further processing or wave shaping to conform to a signal type being used at the receiving end. In general, high speed digital data transmission does not produce signals with sharply defined transitions. For example, a high speed digital transmission may look more like a sine wave than a square wave. Decision circuit 22 performs the wave shaping of the amplified signal from amplifier 19. Data transmission error is minimized by having decision circuit 22 sense the amplified signal at a maxima or minima, providing an increased signal to noise ratio. Clock extraction circuit 20 generates a clock signal for decision circuit 22 that is centered about the maxima and minima of the small signal current signal of photodiode 17. Decision circuit 22 outputs a signal to demultiplexer 23 corresponding to the small current signal generated by photodiode 17. Frequency divider circuit 21 generates a signal from the clock signal of clock extraction circuit 22 to select a data channel output of demultiplexer 23. The signal provided by decision circuit 22 is output at the selected data channel output of demultiplexer 23.

Integrated optical receiver circuits being offered in the marketplace that operate at transmission rates greater than one gigabit/second are typically implemented in gallium arsenide (GaAs). The GaAs integrated optical receiver circuits comprise a photodetector and a transimpedance amplifier. High levels of integration are not easily accomplished in GaAs nor is it cost effective. In general, a two chip solution is required to build a complete optical receiver system.

Accordingly, it would be advantageous to have an integrated circuit capable of high levels of integration with an efficient photodetector and a method for manufacturing the integrated circuit. It would be of further advantage for the photodetector to operate at frequencies up to 3 gigabits/second with a substantially reduced cost.

BRIEF DESCRIPTION OF THE DRAWINGS

FIG. 1 is a schematic diagram of a prior art transmitter and receiver system for sending data across an optical fiber;

FIG. 2 is a cross-sectional view of a prior art lateral silicon photodiode;

FIG. 3 is a schematic diagram of an integrated optical receiver in accordance with the present invention;

FIG. 8 is a cross-sectional view of the silicon photodetector of FIG. 7 further including an npn transistor; and FIG. 9 is a cross-sectional view of the silicon photodetector of FIG. 7 further including a field effect transistor.

DETAILED DESCRIPTION OF THE DRAWINGS

Figure 4:
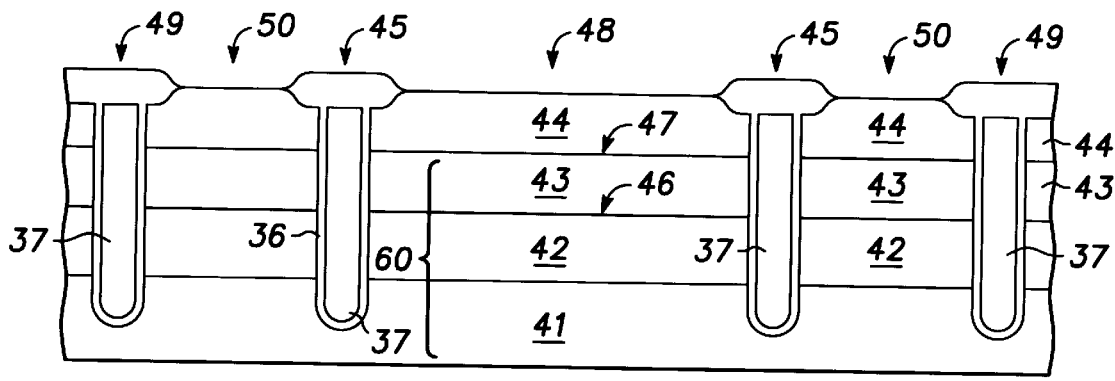
FIG. 4 is a cross-sectional view of a silicon photodetector during processing in accordance with the present invention.

In general, silicon based devices are cheaper to manufacture than GaAs devices. The semiconductor industry is dominated by silicon manufacturing facilities which provide a substantial economy of scale in device fabrication. A significant amount of research is being focused on forming optical solutions in silicon for the transmission and reception of data. In particular, light having a wavelength greater than approximately 600 nanometers is of interest. For example, light having wavelengths of 650 nanometers, 790 nanometers, and 827 nanometers is used for data transmission in plastic fiber, Compact Disk (CD) lasers, and for data transmission in Local Area Networks (LANs), respectively.

Discrete silicon optical receivers are commonly sold as an inexpensive alternative to integrated GaAs optical receivers. A discrete silicon optical receiver comprises a discrete pin diode connected to an amplifier. The amplifier includes at least a transimpedance amplifier for converting and amplifying a current signal produced by the discrete photodetector.

A discrete silicon optical receiver has several disadvantages when compared to an integrated GaAs optical receiver, which is comprised of a transimpedance amplifier integrated with a photodetector. The silicon pin diode is formed in one die and is connected by wire bonds or other interconnect to the amplifier circuit, which is formed in a separate die, to form the optical receiver. In general, the discrete silicon pin diode and the amplifier are housed in a single package. A lead frame is used for mounting the two die required to form the optical receiver. The cost of manufacture is increased by the extra steps required to form the two chip package. Typically, a silicon photodetector such as a pin diode is formed having a top or front side cathode contact and a back or bottom side anode contact. The back side contact precludes the incorporation of other circuitry on the pin diode die. Conductive mounting of the discrete pin diode on a lead frame increases parasitic capacitance, reducing the pin diode's speed of operation. Interconnect between the discrete silicon photodetector and the amplifier loads the pin diode and adds inductance, which decreases the performance of the optical receiver. The interconnect between the die of the optical receiver is also susceptible to electromagnetic interference which further degrades performance.

FIG. 2 is a cross-sectional view of a prior art lateral silicon photodiode illustrating the integration of a transimpedance amplifier with the photodiode. The lateral silicon photodiode overcomes the problems of loading and electromagnetic interference by eliminating the wire bond or lead frame interconnect between the photodiode and the transimpedance amplifier. Moreover, the photodiode can be manufactured using a typical Very Large Scale Integrated circuit (VLSI) process flow.

A silicon substrate 21 is electrically isolated from the photodiode by a buried oxide layer 22 and an oxide trench surrounding the device. An intrinsically doped n-type layer 25 is formed on buried oxide layer 22. Buried oxide layer 22 and the oxide trench isolate the photodiode from other devices which form the transimpedance amplifier. The oxide trench comprises a deep trench 23 and a shallow trench 24. The deep trench is formed by etching and reaches at least buried oxide layer 22. Often the trench extends into silicon substrate 21. Shallow trench 24 is then etched which increases the isolation area near the surface of intrinsically doped layer 25. Deep trench 23 and shallow trench 24 are filled with an isolation material such as, for example, silicon dioxide.

The photodiodes are pin diodes comprising an N+ cathode, an intrinsically doped region, and a P+ anode. The intrinsically doped region comprises intrinsically doped layer 25 electrically isolated from other circuitry by the oxide trench and buried oxide layer 22. Polysilicon regions 26A and 26B corresponding to the N+ cathode and the P+ anode, respectively, are formed on a surface of intrinsically doped layer 25. Polysilicon regions 26A and 26B are alternately doped N+ or P+, respectively. Some of the N+ or P+ dopant is driven through the polysilicon region forming N+ regions 27 and P+ regions 28 in intrinsically doped layer 25. Metal contacts 29 are formed on the doped polysilicon regions 26A and 26B. Metal contacts 29 allow the pin diode to be connected to other circuitry via a metal interconnect layer (not shown).

The N+ regions 27 and P+ regions 28 are formed adjacent to one another on a top surface of the integrated circuit, thus the photodiodes are lateral devices. The lateral photodiodes have poor responsivity, for example 0.07–0.1 (ampere*centimeter$^2$)/watt for 827 nanometer light. This responsivity is approximately one-quarter (¼) the responsivity of an integrated GaAs optical receiver characterized for the same wavelength light. Furthermore, the lateral silicon photodiodes have a higher 1/f noise due to increased defectivity near the surface of the integrated circuit, where f is the frequency of the signal.

It should be noted that for a standard vertical silicon photodetector (not shown), the low responsivity is due to the shallow junction depth of the absorption region. Also, the shallow junction depth allows the creation of light generated electron-hole pairs outside the electric field area of the photodiode space charge region. This results in photodiodes that are susceptible to having a slow tail to the photocurrent. The tail in the photocurrent corresponds to additional time required for electron-hole pairs formed outside the electric field area to form current within the photodiode.

FIG. 3 is a schematic diagram of an integrated optical receiver 31 in accordance with the present invention. The optical receiver comprises a pin diode 32 and a transimpedance amplifier 35. Transimpedance amplifier 35 comprises an amplifier 33 and a resistor 34 and converts an optically generated current from pin diode 32 into a voltage. Transimpedance amplifier 35 is designed to operate at gigahertz speeds and has a low impedance output capable of driving a voltage amplifier that further amplifies the signal.

Pin diode 32 is reverse biased having an anode connected to a lower voltage potential, e.g. ground, than its cathode. An optical signal received by pin diode 32 generates a current because electron-hole pairs are created in the electric field across pin diode 32. Amplifier 33 is connected to pin diode 32 for receiving the optically generated current. Amplifier 33 has an inverting input connected to the cathode of photodiode 32, a non-inverting input connected to a reference potential such as, for example, ground, and an output. Negative feedback is employed to convert the optically generated current to a voltage. Resistor 34 is a feedback resistor for amplifier 33 having a first input connected to the inverting input of amplifier 33 and a second input connected to the output of amplifier 33. The voltage generated by integrated optical receiver 31 is approximately equal to the product I*R, where I is the current magnitude of the optically generated current and R is the resistance of resistor 34. The magnitude of the voltage signal output by amplifier 33 is typically in the range of 5 millivolts to 100 millivolts.

An example of an amplification stage for converting photodiode current to a high frequency voltage signal is disclosed in U.S. Pat. No. 5,304,949, entitled COMMON BASE AMPLIFIER which is hereby incorporated by reference. U.S. Pat. No. 5,304,949 discloses a photodiode connected to a common base amplifier. Prior art integrated optical receivers connect a transimpedance amplifier to the photodetector diode. The high input impedance of the transimpedance amplifier and the parasitic capacitance across the photodetector diode produce a low frequency pole that limits the frequency of operation of the integrated optical receiver.

The common base amplifier of U.S. Pat. No. 5,304,949 isolates the transimpedance amplifier from the parasitic capacitance across the pin diode. The common base amplifier has a low input impedance that moves the pole to a higher frequency, thereby extending the frequency response of the amplification stage. The common base amplifier comprises a single transistor operating in a unity current gain configuration. A bias circuit biases the single transistor for maximum frequency operation.

FIG. 4 is a cross-sectional view of a silicon photodetector during manufacture in accordance with the present invention. The silicon photodetector maximizes the sensitivity of a photodetector by increasing the absorption of light while allowing the integration of other device types. The silicon photodetector includes a silicon substrate 41 that is heavily doped with a dopant having a dopant concentration of, for example, greater than 1E17 atoms/centimeter$^3$. By way of example, substrate 41 is p-type having a doping concentration exceeding 1E17 atoms/centimeter$^3$.

An intrinsically doped layer 42 is formed on silicon substrate 41. In general, the thickness of intrinsically doped layer 42 is greater than 2.5 micrometers (microns). The wavelength of light being coupled to the optical receiver corresponds to the location of the pin diode relative to the surface of the integrated circuit. Intrinsically doped layer 42 is doped either n or p type. The doping concentration of intrinsically doped layer 42 is less than 1E15 atoms/centimeter$^3$. In an embodiment of the photodetector process, intrinsically doped layer 42 is doped p-type.

A buried layer 43 is formed on intrinsically doped layer 42. Buried layer 43 is heavily doped having, for example, a doping concentration greater than 1E17 atoms/centimeter$^3$. In general, buried layer 43 has a thickness greater than 1 micron. In an embodiment of the photodetector process, buried layer 43 is n-type having a doping concentration exceeding 1E17 atoms/centimeter$^3$ and a thickness of approximately 1.5 microns.

An epitaxial layer 44 is formed on buried layer 43 and is the surface layer of the photodiode. Epitaxial layer 44 is not doped at the high concentration levels of buried layer 43 allowing the formation of high speed bipolar or CMOS transistors. In general, epitaxial layer 44 has a thickness greater than 0.5 microns. In an embodiment of the photodetector process, epitaxial layer 44 is n-type having a thickness of approximately 1 micron. The doping concentration of epitaxial layer 44 is optimized for the device type being formed therein.

An isolation region 45 isolates the photodetector diode from other circuitry. In an embodiment of the photodetector process, isolation region 45 is formed by a trench that is cut through epitaxial layer 44, buried layer 43, intrinsically doped layer 42, and that extend into silicon substrate 41. An oxide layer 36 is formed on the trench surface. The remaining portions of the trench is filled with undoped polysilicon 37. An isolation region 49 is formed simultaneously with isolation region 45 to isolate a top side substrate contact region 50. Top side substrate contact region 50 is formed between isolation region 45 and isolation region 49. Other well known techniques could also be employed to form isolation region 45 and 49.

The semiconductor area within the boundary created by isolation region 45 forms an intrinsically doped region 46, a buried layer region 47, and an epitaxial layer region 48. Silicon substrate 41 (p-type), intrinsically doped region 46 (intrinsic), and buried layer region 47 (n-type) form a pin diode 60 for optically generating current. In accordance with the present invention, the pin diode is formed beneath a surface layer of the device. In the embodiment described hereinbefore, substrate 41 is the anode and buried layer region 47 is the cathode of the pin diode.

Prior art silicon photodetector processes that allow integration of other circuitry, e.g., a transimpedance amplifier, have poor responsivity because the photodetector has a shallow junction. The detector described hereinbefore has a collection area that is approximately 2.5 microns or greater below the surface. Calculations for the absorption of different wavelengths of light yield an increased depth for the collection area as the wavelength of the light increases. For example, high speed optical data transmission using 650 nanometer, 790 nanometer, and 827 nanometer light have absorption depths of 3.3 microns, 7.8 microns, and 13 microns, respectively. The appropriate absorption depth is achieved by controlling the thicknesses of epitaxial layer 44, buried layer 43, and intrinsically doped layer 42.

Figure 5:
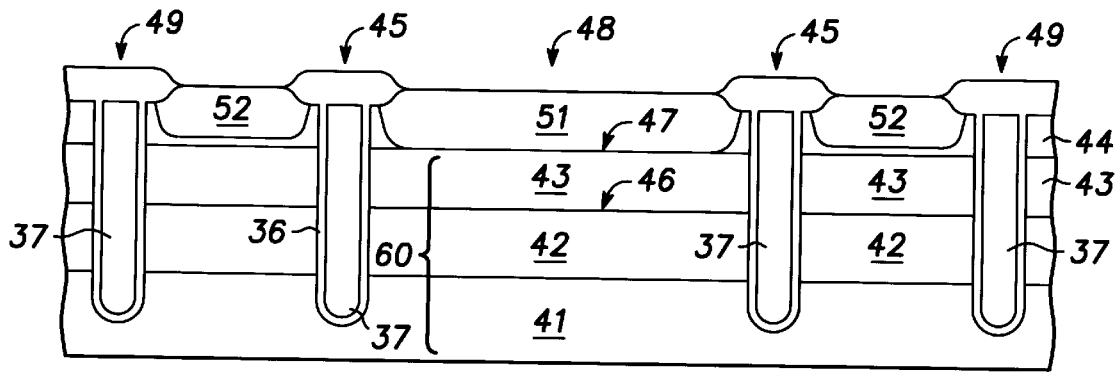
FIG. 5 is a cross-sectional view of the silicon photodetector of FIG. 4 further along in processing.

FIG. 5 is the cross-sectional view of the silicon photodetector of FIG. 4 further along in processing and including additional implants. A heavily doped implant region 51 is placed in epitaxial layer region 48 to form a low resistance path to buried layer region 47. As shown, implant region 51 extends from the surface of the integrated circuit to at least the interface between epitaxial layer region 48 and buried layer region 47. In an embodiment of the photodetector process, implant region 51 is an n-type implant having a doping concentration greater than 1E17 atoms/centimeter$^3$.

Similarly, an implant dopes epitaxial layer 44 between isolation regions 45 and 49, forming implant region 52. It should be noted that formation of implant region 52 is optional. A top side substrate contact is formed in this area. In an embodiment of the photodetector process, implant region 52 is the same dopant type as the substrate contact. For example, implant region 52 is a p-type implant having a doping concentration greater than 1E17 atoms/centimeter$^3$. Implant region 52 lowers the resistance of the top side substrate contact.

Figure 6:
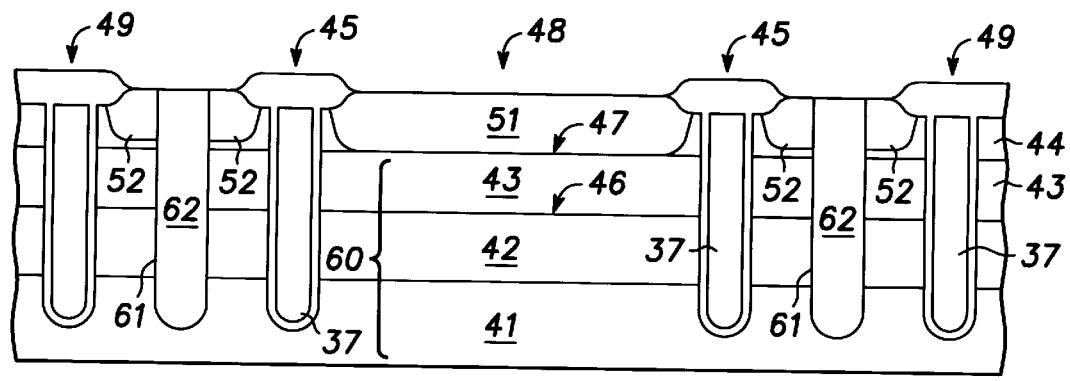
FIG. 6 is a cross-sectional view of the silicon photodetector of FIG. 5 further along in processing and including a top side substrate contact.

FIG. 6 is the cross-sectional view of the silicon photodetector of FIG. 5 further along in processing and including a top side substrate contact. The top side substrate contact forms a low resistance path to substrate 41 allowing circuitry such as a transimpedance amplifier to be connected to the anode of the pin diode. The top side substrate contact is formed in the area between isolation regions 45 and 49. A trench 61 is etched from the surface of the integrated circuit to silicon substrate 41. Trench 61 is preferably filled with heavily doped polysilicon 62 that has a doping concentration greater than 1E17 atoms/centimeter$^3$. It should be noted that polysilicon 62 serves as the top side contact. Alternatively, trench 61 can be filled with a high temperature refractory metal such as, for example, tungsten. In an embodiment of the photodetector process, polysilicon 62 is p-type and has a doping concentration exceeding 1E21 atoms/centimeter$^3$ to ensure low resistance.

Figure 7:
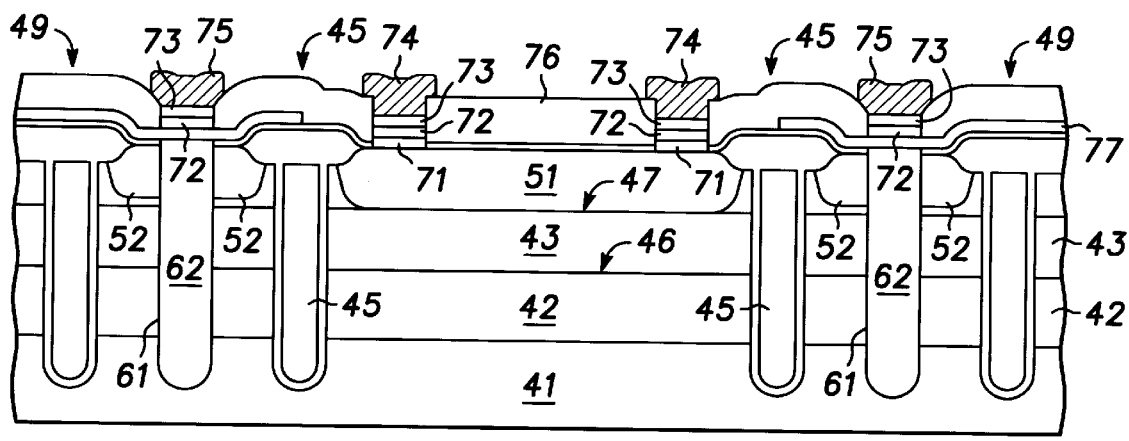
FIG. 7 is a cross-sectional view of the silicon photodetector of FIG. 6 further along in processing and including a top side interconnect for the pin diode.

FIG. 7 is the cross-sectional view of the silicon photodetector of FIG. 6 further including top side interconnect for the pin diode. As mentioned hereinbefore, pin diode 60 is defined by the area within isolation region 45 and comprises silicon substrate 41, intrinsically doped region 46, and buried layer region 47. The collection area of the pin diode is located below the surface at a predetermined depth to maximize the absorption of light for the creation of electron-hole pairs to convert an optical signal to an electrical current.

Buried layer region 47 serves as the cathode of the pin diode. Connection to buried layer region 47 is vertically above the device. Implant region 51 provides a low resistance path to the surface of the integrated circuit. A dielectric layer 76 is formed over the pin diode. Although dielectric layer 76 serves as a passivation layer, it could also perform an optical filter function in such applications as color discriminating pin diode arrays. Openings are etched in dielectric layer 76 to expose implant region 51. In an embodiment of the pin diode, polysilicon 71 is deposited and doped in the contact regions to contact implant region 51. A platinum layer 72 is formed on polysilicon 71. Platinum layer 72 combines with polysilicon 71 to form a low resistance platinum silicide layer. A barrier layer 73 of titanium and tungsten is formed on platinum layer 72. Finally, a cathode contact 74 of aluminum copper is formed on barrier layer 73. Cathode contact 74 is used as a connection point for the other circuitry to connect to the pin diode. It should be understood that the type of metal is not a limitation of the present invention and that other combinations of alloys and metals can be used for the formation of contacts and interconnects.

Substrate 41 serves as the anode of the pin diode. A connection point is brought to the surface of the integrated circuit. Substrate 41 connects to polysilicon 62 which is exposed for contact at the surface. In an embodiment of the pin diode a polysilicon layer 77 is formed on polysilicon 62. Dielectric layer 76 overlies polysilicon layer 77. An opening is etched in dielectric layer 76 to expose polysilicon layer 77. Platinum layer 72 is formed on polysilicon layer 77 and combines with polysilicon layer 77 to form a low resistance platinum silicide layer. The barrier layer 73 of titanium and tungsten is formed on platinum layer 72. Finally, an anode contact 75 of aluminum copper is formed on barrier layer 73. Anode contact 75 is used as a connection point for circuitry to connect to the anode of the pin diode.

FIG. 8 is a cross-sectional view of the silicon photodetector of FIG. 7 further including an npn transistor. High performance transistors are formed in epitaxial layer 44. The addition of high performance transistors allows the integration of a silicon pin diode and an amplification stage. The pin diode comprises substrate 41, intrinsically doped region 46, and buried layer region 47. Intrinsically doped region 46 and buried layer region 47 of the pin diode are formed by isolation region 45. A contact is brought to the surface of the integrated circuit by polysilicon 62. Polysilicon 62 is isolated from other regions by isolation regions 45 and 49.

In general, isolated regions in epitaxial layer 44, buried layer 43, and intrinsically doped layer 42 are formed between isolation structures. In an embodiment of the silicon photodiode, an isolation region is formed by etching a trench from the surface of the integrated circuit into substrate 41. A layer of dielectric material is formed on the trench surface. The remaining portion of the trench is filled with undoped polysilicon. Isolation regions are used to electrically isolate areas of the integrated circuit from one another, thereby allowing the formation of devices such as transistors, resistors, or capacitors.

An isolation region 81 electrically isolates an area of the integrated circuit to illustrate how additional devices are formed in the photodiode process. An npn transistor is formed in the area within the boundary set up by isolation region 81. An intrinsically doped region 82, an n-type buried layer region 83, and an epitaxial layer region 84 are formed by isolation region 81. The collector of the npn transistor is epitaxial layer region 84. Buried layer region 83 is a low resistance path for the collector of the npn transistor. Intrinsically doped region 82 isolates substrate 41 from buried layer region 83 to reduce the parasitic capacitance, thereby extending the frequency response of the transistor.

An implant is formed in epitaxial layer region 84 to create a low resistance path 85 from the buried layer region 83 to the surface of the integrated circuit. An implant of, for example, p-type dopants, into epitaxial layer region 84 forms a base region 86 of the transistor. An opening is formed in a dielectric layer to expose base region 86. A polysilicon layer 87 is formed to contact base region 86. Polysilicon layer 87 has the same doping type as base 86, e.g., p-type. An area underneath polysilicon layer 87 is also doped when doping polysilicon layer 87. The area forms a low resistance contact to base region 86 to lower the base resistance.

Openings in a dielectric layer are formed to contact low resistance path 85 and base region 86. A polysilicon layer 89 is formed in the opening to contact low resistance path 85. A polysilicon layer 88 is formed in the opening to contact base region 86. In an embodiment of the photodiode, polysilicon layer 88 contacts base region 86 in a central location of base region 86. Polysilicon layer 87 contacts the periphery of base region 86. Polysilicon layer 87 and polysilicon layer 88 are isolated from one another by a dielectric layer. It should be noted that layers 88 and 89 have the same doping type. The emitter of the transistor is formed when some of the dopant diffuses from polysilicon layer 88 into base region 86.

The collector, base, and emitter of the npn transistor have metal contacts 90 for connecting to other circuitry of the integrated circuit. The contacts are formed using techniques as described hereinbefore for the formation of other contacts. For example, openings are etched in the dielectric layer exposing the polysilicon contacting the collector, base, or emitter. A platinum layer is deposited on the exposed polysilicon to form platinum silicide. A barrier metal such as titanium, tungsten, or combination thereof, is then deposited on the platinum layer. Finally, an alloy of aluminum and copper is formed on the barrier metal. In general, the photodiode has at least one layer of metal interconnect for interconnection of the contacts and often several layers of interconnect depending on the complexity of the process. Although only a single transistor is shown, it should be obvious to one skilled in the art that other devices are similarly formed by creating regions electrically isolated from one another and forming devices therein. Alternatively, a pnp bipolar transistor (not shown) can be formed in an n-well.

FIG. 9 is a cross-sectional view of the silicon photodetector of FIG. 7 further including a field effect transistor. In an embodiment of the silicon photodetector, high performance field effect transistors are formed in an n-well 93. A p-channel Metal Oxide Semiconductor Field Effect Transistor (MOSFET) is formed in n-well 93. Alternatively, an n-channel MOSFET (not shown) can be formed in a p-well instead of n-well 93. The p-well could be formed separately or in n-well 93. The addition of high performance complementary field effect transistors allows the integration of the amplification stage with the silicon pin diode. The pin diode comprises substrate 41, intrinsically doped region 46, and buried layer region 47.

In general, isolated areas in epitaxial layer 44, buried layer 43, and intrinsically doped layer 42 are formed by isolation regions. For example, isolation region 45 defines the pin diode while isolation regions 45 and 49 define an area for the top side substrate contact. An isolation region 91 electrically isolates an area of the integrated circuit in which the p-channel MOSFET will be fabricated. The p-channel MOSFET is formed within the area defined by the boundary of isolation region 91.

In an embodiment of the silicon photodiode, an intrinsically doped region 92 and an n-well region 93 are defined by isolation region 91. Optionally, a heavily doped buried layer 43 is not required for a MOSFET device. Intrinsically doped region 92 isolates substrate 41 from buried n-well 93 to reduce the bulk capacitance of the transistor. A polysilicon layer 95 is formed to contact n-well 93. Polysilicon layer 95 is an interconnect for the drain and source of the transistor. Polysilicon layer 95 is doped p-type. Some of the dopant of polysilicon layer 95 is transferred to n-well 93. A p-type drain region 96 and a p-type source region 97 are formed by the dopant. The gate length of the transistor is defined by the distance between drain region 96 and source region 97. Polysilicon layer 95 extends from drain region 96 to allow room for a drain contact to be formed. Similarly, polysilicon layer 95 extends from source region 97 to allow room for a source contact to be formed. It should be noted that although polysilicon layer 95 is formed in the drain and source areas at the same time, these areas are not electrically shorted together.

A high quality gate dielectric layer 94 is formed on the surface of n-well 93 between and partially overlapping drain region 96 and source region 97. A polysilicon layer 98 is formed on gate dielectric layer 94. Polysilicon layer 98 is a gate electrode of the transistor. A dielectric layer isolates polysilicon layer 98 from polysilicon layer 95.

Contacts 100, 101, and 102 to the gate electrode, i.e., polysilicon layer 98, the drain electrode, and the source electrode, respectively, are formed similarly to the contacts for the photodiode described hereinbefore. For example, a silicide layer is deposited on the exposed polysilicon of the gate to form a silicide layer. By way of example, the silicide layer is a layer of platinum silicide. A barrier metal such as titanium, tungsten, or combination thereof, is then deposited on the platinum layer. Finally, an alloy of aluminum and copper is formed on the barrier metal. Although only a single transistor is shown, it should be obvious to one skilled in the art that other devices are similarly formed by creating regions electrically isolated from one another and forming devices therein.

Integrating a highly sensitive pin diode with an amplifier stage in a silicon wafer process provides significant advantages over prior art silicon optical receivers. Prior art discrete silicon photodiodes connected via bond wires to an amplification stage are susceptible to electromagnetic interference which degrades the performance of the optical receiver. The frequency response of the optical receiver is substantially improved by reducing the parasitic capacitance associated with interconnecting discrete semiconductor die together. Other integration efforts in silicon typically involve a module for adding a photodiode to a standard VLSI process. In general, photodiodes on a VLSI process are formed on the surface of the integrated circuit. Surface or near surface silicon photodiodes have poor responsivity and a higher 1/f noise due to surface operation. An integrated silicon optical receiver has advantages over an integrated GaAs optical receiver. For example, a silicon optical receiver has a lower cost of manufacture, better yield, and higher reliability.

A pin diode for maximum responsivity for detecting light having a wavelength greater than 600 nanometers should be formed at a depth in the integrated circuit that is one to three times the absorption length. The process shown in FIGS. 4–9 is optimized for light absorption greater than approximately 600 nanometers. In particular, the layers which comprise the pin diode are formed below a surface layer, e.g., the epitaxial layer, of the integrated circuit. For example, the substrate, intrinsically doped layer, and the buried layer are used to form a subsurface pin diode. The epitaxial layer formed on the buried layer has the major surface of the integrated circuit thus the three pin diode layers are below the surface layer. Devices such as transistors are formed in the epitaxial (surface) layer. Moreover, the depth of the pin diode is easily controlled for maximum light absorption without affecting the surface layer. The buried layer or intrinsically doped layer can be made thicker to accommodate longer wavelengths with little or no impact on the devices being formed in the epitaxial layer. For example, the absorption depth for light having a wavelength of 827 nanometers should be greater than 13 micrometers.

A pin diode is characterized by parameters such as sensitivity, responsivity, linearity, dark current, shunt resistance, junction capacitance, reverse breakdown voltage, response time, and noise current. It should be noted that sensitivity and responsivity are related to one another. Sensitivity is the short circuit current (amperes) generated by the pin diode at a predetermined light level divided by the energy of the incident light (watts). The light source is typically an incandescent tungsten lamp operating at a color temperature of 2850 degrees Kelvin. The short circuit current magnitude of a pin diode at the predetermined light level is a function of the device configuration, diode area, and packaging. The responsivity is the sensitivity divided by the active area of the pin diode. Prior art silicon photodetectors have a responsivity in the range of 0.07–0.10 (ampere*centimeter$^2$)/watt, which is not a very high responsivity. The subsurface pin diode fabricated as described hereinbefore has a responsivity two to three times better (approximately 0.25 (ampere*centimeter$^2$)/watt) than prior art silicon photodetectors.

The optical signal provided to an optical receiver is either a digital signal or an analog signal. Linearity is an important parameter for an optical analog signal. In general, a pin diode has linear characteristics if the current generated by the pin diode varies linearly with the light intensity being applied to the optical receiver. Linearity at low light levels is affected by factors such as the shunt resistance, dark current, and noise current. Linearity at high light levels is affected by the series resistance of the pin diode. In general, series resistance is made as small as possible and shunt resistance is made as large as possible. The subsurface pin diode of FIGS. 4–9 has a low series resistance. For example, a resistive path from the anode (substrate) of the subsurface pin diode to the contact on the surface of the integrated circuit is approximately 0.1 ohms or less. Similarly, a resistive path from the cathode (buried layer) of the subsurface pin diode to the contact on the surface of the integrated circuit is approximately 0.1 ohms or less. The subsurface pin diode is excellent for analog optical applications because of the linear behavior at high light levels.

The shunt resistance is a junction resistance measured with zero volts applied across a pin diode. The shunt resistance also affects the noise generated by the pin diode. The subsurface pin diode has a high shunt resistance due to the high resistance of the intrinsically doped region of the diode. The high value of shunt resistance aids in linear operation at low light levels. For example, the shunt resistance for the subsurface device of the present invention can range from a few hundred mega-ohms to greater than several giga-ohms.

A dark current is defined as the current that flows through a pin diode when it does not receive any light. The dark current is measured with the pin diode being reverse biased. An optical signal sensed by a pin diode will also have a dark current component that adds to the optically generated current, thereby producing an error. In general, the dark current should be as small as possible when compared to optical currents generated by low light levels. The subsurface pin diode has a low dark current because the device is formed having abrupt junctions. Dark current is extremely temperature dependent having a temperature coefficient that doubles the current with every 10 degrees Celsius increase in temperature. The dark current of the present invention is in the pico-ampere range at room temperature.

Noise current also limits low light level performance of a pin diode by adding an error current to the optically generated current. A dominant noise source of a pin diode is thermal noise. Thermal noise is inversely related to the shunt resistance of the pin diode, thus the subsurface pin diode has minimal noise current. Other types of noise that affect pin diodes are shot noise, flicker noise, and 1/f noise.

Digital optical receivers are not as concerned with the relationship between the light level being transmitted and the converted electrical signal level over a wide range of optical input signal levels. An optical digital signal has two states, one state is when light is transmitted and the other state is when light is not transmitted. It should be noted that a pin diode optimized for linear applications will also be excellent for digital applications. Digital applications typically require high speed optical reception and conversion to an electrical signal.

The responsivity or sensitivity to the light being transmitted is one factor for high speed pin diode operation. The subsurface pin diode configuration described hereinbefore allows the device to be formed for optimal absorption of light having a wavelength greater than approximately 600 nanometers. In other words, the subsurface pin diode efficiently creates electron-hole pairs that are converted to a current. The subsurface pin diode rapidly creates electron-hole pairs when exposed to light. The vertically stacked configuration (N+, intrinsic, P+) of the subsurface pin diode is reverse biased exposing optically created electron-hole pairs to a high electric field that attracts the electron-hole pairs to the respective cathode and anode thereby generating a current. Prior art pin diodes are prone to creating electron-hole pairs outside the electric field of the pin diode which generates a tail current that affects the speed of operation.

Junction capacitance is another factor that relates to the speed of operation of a pin diode. The junction capacitance of the subsurface pin diode is approximately 50 percent less than prior art pin diodes. The substantial reduction in capacitance is due to the isolation regions that eliminate sidewall capacitance of the pin diode. The reduction is capacitance extends the frequency of operation.

Series resistance is also a factor in the speed of operation of a pin diode. As described hereinbefore, the subsurface pin diode has low series resistance ensuring high speed operation.

By now it should be appreciated that a process for forming a high performance silicon optical device such as an optical receiver having a pin diode and a transistor has been provided. The process allows the formation of a pin diode with an amplifier stage. The pin diode is formed from layers beneath a surface layer of the device. The transistors and other devices of the integrated circuit are formed in the surface layer. The photodetector is ideal for light having wavelengths greater than approximately 600 nanometers for high speed data transmission. In addition, the photodetector of the present invention is not limited to having a top side contact, but is also suitable for devices having bottom side contacts. Further, the method and device of the present invention are suitable for manufacturing voltage variable capacitors.

We claim:

1. A light sensitive device, comprising:
   a silicon substrate of a first conductivity type;
   an intrinsically doped layer on said silicon substrate;
   a first layer of a second conductivity type on said intrinsically doped layer wherein said silicon substrate, a region of said intrinsically doped layer, and a region of said first layer form a pin diode for receiving an optical signal;
   a second layer of said second conductivity type on said first layer; and
   a top side contact of said first conductivity type formed through said first, second, and intrinsically doped layers to couple to said substrate.

2. The light sensitive device of claim 1, wherein a combined thickness of said first layer and said second layer is greater than 2.5 micrometers.

3. The light sensitive device of claim 2, wherein said intrinsically doped layer has a thickness greater than 2.5 micrometers.

4. The light sensitive device of claim 3, further including a first isolation region that isolates said region of said first layer, said region of said intrinsically doped layer, and a region of said second layer from other devices of an integrated circuit.

5. The light sensitive device of claim 4, wherein said top side contact is isolated from said regions of said first layer, said second layer, and said intrinsically doped layer by said first isolation region.

6. The light sensitive device of claim 5, further including a contact coupled to said region of said second layer, wherein said contact coupled to said region of said second layer couples to an electrode of said pin diode.

7. The light sensitive device of claim 6, wherein said top side contact comprises an etched trench filled with doped polysilicon having a concentration greater than 1E17 atoms/centimeter$^3$.

8. The light sensitive device of claim 7, further including a second isolation region wherein said first and second isolation regions isolate said top side contact.

9. The light sensitive device of claim 8, wherein said first and second isolation regions each comprise:
   a trench formed through said first layer, said second layer, and said intrinsically doped layer to said silicon substrate;
   an oxide layer formed on a surface area of said trench; and
   an undoped polysilicon filling said trench.

10. The light sensitive device of claim 1, wherein said silicon substrate has a doping concentration greater than 1E17 atoms/centimeter$^3$.

11. The light sensitive device of claim 1, wherein said intrinsically doped layer has a doping concentration less than 1E15 atoms/centimeter$^3$.

12. The light sensitive device of claim 1, wherein said first layer has a doping concentration greater than 1E17"atoms/centimeter$^3$.

13. A light sensitive device, comprising:
   a silicon substrate of a first conductivity type;
   an intrinsically doped layer on said silicon substrate;
   a first layer of a second conductivity type on said intrinsically doped layer wherein said silicon substrate, a region of said intrinsically doped layer, and a region of said first layer form a pin diode for receiving an optical signal;
   a second layer of said second conductivity type on said first layer; and
   at least one transistor in said second layer.

14. The light sensitive device of claim 13, further including a top side contact of said first conductivity type formed through said first, second, and intrinsically doped layers to couple to said substrate.

15. The light sensitive device of claim 13, further including a first isolation region that isolates said region of said first layer, said region of said intrinsically doped layer, and a region of said second layer from other devices of an integrated circuit.

16. The light sensitive device of claim 15, wherein said top side contact is isolated from said regions of said first, second, and intrinsically doped layers by said first isolation region.

17. The light sensitive device of claim 16, further including a contact coupled to said second region to couple to an electrode of said pin diode.

18. The light sensitive device of claim 17, wherein said top side contact comprises an etched trench filled with doped polysilicon having a concentration greater than 1E17 atoms/centimeter$^3$.

19. The light sensitive device of claim 18, further including a second isolation region wherein said first and second isolation regions isolate said top side contact.

20. The light sensitive device of claim 19, wherein said first and second isolation regions each comprise:

a trench formed through said first, second, and intrinsically doped layers to said silicon substrate;

an oxide layer formed on a surface area of said trench; and an undoped polysilicon region filling said trench.

* * * * *